United States Patent [19]

Pierce

[11] Patent Number: 5,422,289

[45] Date of Patent: Jun. 6, 1995

[54] METHOD OF MANUFACTURING A FULLY PLANARIZED MOSFET AND RESULTING STRUCTURE

[75] Inventor: John M. Pierce, Palo Alto, Calif.

[73] Assignee: National Semiconductor Corporation, Santa Clara, Calif.

[21] Appl. No.: 874,675

[22] Filed: Apr. 27, 1992

[51] Int. Cl.⁶ ............................................. H01L 21/00
[52] U.S. Cl. ....................................... 437/32; 437/40; 437/41
[58] Field of Search ...................... 437/40, 41, 32, 228

[56] References Cited

U.S. PATENT DOCUMENTS

| | | |
|---|---|---|
| 3,648,125 | 3/1972 | Peltzer . |
| 3,863,395 | 2/1975 | Brown . |
| 4,475,981 | 10/1984 | Rea . |
| 4,488,162 | 12/1984 | Jambotkar ............................ 437/41 |
| 4,671,851 | 6/1987 | Reyer et al. . |
| 4,677,736 | 7/1987 | Brown ................................... 437/41 |
| 4,702,792 | 10/1987 | Chow et al. . |
| 4,713,356 | 12/1987 | Hiruta ................................... 437/41 |
| 4,758,306 | 7/1988 | Cronin et al. . |
| 4,764,480 | 8/1988 | Vora . |
| 4,780,429 | 10/1988 | Roche et al. ........................... 437/41 |
| 4,789,648 | 12/1988 | Chow et al. . |
| 4,803,173 | 2/1989 | Sill et al. .............................. 437/41 |
| 4,818,725 | 4/1989 | Lichtel, Jr. et al. . |
| 4,824,521 | 4/1989 | Kulkarni et al. . |
| 4,824,793 | 4/1989 | Richardson et al. . |
| 4,839,311 | 6/1989 | Riley et al. . |
| 4,910,155 | 3/1990 | Cote et al. . |
| 4,944,836 | 7/1990 | Beyer et al. . |
| 4,954,142 | 9/1990 | Carr et al. . |
| 4,997,781 | 3/1991 | Tigelaar . |
| 5,028,553 | 7/1991 | Esquivel et al. . |
| 5,032,881 | 7/1991 | Sardo et al. . |
| 5,065,273 | 11/1991 | Rajeevakumar . |
| 5,081,516 | 1/1992 | Haskell . |
| 5,084,419 | 1/1992 | Sakao .................................. 437/228 |
| 5,169,491 | 12/1992 | Doan .................................. 156/636 |

FOREIGN PATENT DOCUMENTS

| | | | |
|---|---|---|---|
| 0233791 | 8/1987 | European Pat. Off. ............ 437/41 |
| 53-144687 | 12/1978 | Japan .................................. 437/41 |
| 58-176970 | 10/1983 | Japan .................................. 437/41 |
| 61-218169 | 9/1986 | Japan .................................. 437/41 |
| 62-117329 | 5/1987 | Japan .................................. 437/41 |
| 63-46769 | 2/1988 | Japan .................................. 437/41 |

OTHER PUBLICATIONS

Kaufman et al. Chemical-Mechanical Polishing for Fabricating Patterned W Metal Features as Chip Interconnects, J. Electrochem Soc. 138 3460-3465 (1991).
Patrick et al. Application of Chemical Mechanical Polishing to the Fabrication of VLSI Circuit Interconnections, J. Electrochem Soc. 138 1778-1784 (1991).
Chiu et al., International Electron Devices Meeting (IEDM), 1982, p. 224.
Davari et al., International Electron Devices Meeting (IEDM), 1988, p. 92.
Wen et al., Proc. 1991 VLSI Symposium, p. 83.
Davari et al., Technical Digest of 1989 (IEDM), p. 61.
B. Davari et al., A New Planarization Technique, Using a Combination of RIE and Chemical Mechanical Polish (CMP), (1989) International Electron Devices Meeting, Technical Digest, pp. 61-64.

Primary Examiner—Thi Dang
Attorney, Agent, or Firm—Townsend and Townsend Khourie and Crew

[57] ABSTRACT

A method is disclosed for forming MOSFET devices on a semiconductor substrate including steps of depositing layers of polysilicon, dielectric, and polysilicon again. Each polysilicon layer is planarized after it is deposited. The dielectric layer is patterned and etched to delineate active regions and interconnect grooves. After the second polysilicon layer is planarized, the material in the active region is patterned and etched to form a gate and source and drain areas. The appropriate areas of the active region are doped as necessary to form the source and drain.

21 Claims, 3 Drawing Sheets

METHOD OF MANUFACTURING A FULLY PLANARIZED MOSFET AND RESULTING STRUCTURE

RELATED APPLICATIONS

This application is related to U.S. patent applications Ser. Nos. 07/880,880 and 07/874,493, assigned to the assignee of the present invention and incorporated herein by reference for all purposes. These applications describe planar fabrication methods related to those of the present invention.

BACKGROUND OF INVENTION

The present invention lies in the fields of semiconductor devices and methods for fabricating semiconductor devices, especially in the field of MOS and bipolar devices produced according to these methods. More particularly, the present invention lies in the field of methods for fabricating fully planarized MOSFET structures.

Modern integrated circuit fabrication is a multistep process involving deposition and/or growth of multiple layers, each of which is patterned by photolithography and etching to form the three-dimensional elements that comprise a semiconductor device. For modern devices, the photolithography process must be capable of delineating features of 0.5 $\mu$m or less. Such resolving power requires a total depth of focus of slightly more than 1 $\mu$m. Ideally, each layer should be sufficiently planar that no regions of the surface will fall outside of this focus range. Unfortunately, current methods of fabricating metal oxide semiconductor field effect transistors ("MOSFETs"), do not typically produce highly planar layers. As a result, the minimum possible feature widths are not realized, and the packing density and current output of the device suffer.

In most fabrication processes, a field oxide is initially grown by LOCOS (local oxidation of silicon) or a related procedure to electrically isolate the "active areas" where devices are formed on the substrate surface. The resulting structure consists of an island of silicon (the active area), surrounded by a thick (approximately 0.5 $\mu$m) region of field oxide, elevated above the plane of the substrate. Thus, a "stepped" surface is produced in the very first fabrication step. If this surface is not somehow planarized, each subsequent layer will also contain steps.

By pre-etching the substrate surface, field oxides can be grown that are substantially coplanar with the substrate surface. These processes are, unfortunately, more expensive than traditional LOCOS and are, therefore, not favored. Alternatively, LOCOS can used in conjunction with a planarization step that removes the top of the field oxide layer and produces a planar surface. However, planarizing the relatively hard field oxide layer to exactly the correct depth (i.e., the original level of the substrate) is expensive and time-consuming, especially if an abrasive process such as chemical-mechanical polishing is employed. Thus, most fabrication processes continue to use substrates having the stepped surfaces produced by LOCOS.

After the field oxide has been grown, circuit elements are formed within the active region pockets by a variety of well-known techniques. For example, early in the fabrication process, the substrate may be doped by ion-implantation or diffusion to form local regions of increased conductivity. Such procedures are described in, for example, in U.S. Pat. No. 4,764,480 (issued to Vora and assigned to the assignee of this invention) which is incorporated herein by reference for all purposes. Another early fabrication step is local formation of a thin gate oxide layer on the active silicon areas. Because this material is thin in comparison to the field oxide it does not significantly contribute to the overall planarity of the layer.

After the gate oxide has been formed, a layer of polycrystalline silicon ("polysilicon") is typically deposited over the entire substrate surface. This process is described in, for example, U.S. patent application Ser. No. 502,943 which is assigned to the Assignee of the present invention and incorporated by reference herein for all purposes. The polysilicon surface is then patterned by photolithography and subsequent etching to form MOSFET elements and interconnects. Unfortunately, the stepped topography of the underlying substrate and field oxide is transferred, in part, to the surface of the polysilicon layer during deposition, and shows up as height variations on the new surface. These height variations are, in turn, translated into height and thickness variations in the photoresist layer. The resist height variations cause focus variations in the projected optical image, while the resist thickness variations cause differences in the optimum amount of optical energy required to expose the full depth of the resist. Thus, strips of photoresist which cross from field areas to active areas over the steps are difficult to expose properly.

An entirely different problem is also caused by depositing polysilicon on nonplanar surfaces. The conformally deposited polysilicon layer is actually thicker over the step regions than over other regions. Thus, in subsequent etch steps, the polysilicon over the thin gate oxide is cleared before the polysilicon over the steps. Although etch conditions are tailored to remove polysilicon faster than oxide, the gate oxide and underlying substrate can still be damaged while the extra polysilicon is being removed from the steps. As a result, the process yield and MOSFET reliability may be reduced.

During etch steps, polysilicon is cleared from the source and drain areas, leaving a narrow central strip of material called the gate. This process thus divides the active region into three parts: the gate area, the source area, and the drain area. In most conventional processes, the exposed regions of the active area are then doped to form source and drain regions of the MOSFET. Next, a layer of dielectric material is deposited over the entire wafer. The surface of this layer is, of course, non-planar like the surface below it. Subsequent photolithography steps used to define openings in the dielectric layer (for metal contacts to the source and drain regions and to the gate metal strips) must therefore contend with the undulations of the dielectric surface. In addition, the dielectric layer is now substantially thicker over the source/drain areas than over the polysilicon on the field oxide. Contact holes must eventually be etched through the dielectric layer to reach both of these areas. Unfortunately, the thickness variations in the dielectric layer complicate this step.

As can be seen from the above discussion, each new process step tends to exacerbate the problems of the previous step. As additional layers are added during the fabrication process, the uneven surface at the bottom of the device propagates, at least in part, to the higher levels of the device. In some instances, the surface roughness actually becomes worse with each succeeding layer. The etch processes further complicate the procedure by introducing new protrusions and valleys that propagate upward during fabrication.

Several methods exist to alleviate one or more of these undesirable features. First, as explained above, some methods produce a field oxide that is coplanar with the active areas, thus reducing the severity of the surface height variations. Examples of such methods include the "ISOPLANAR" technology coupled with a planarization step, as discussed in U.S. Pat. No. 4,764,480, (previously incorporated herein by reference), the "SWAMI" technology described by Chiu, et al., IEDM, 1982, p. 224, and a planarized shallow trench isolation technology described by Davari et al., IEDM, 1988, p. 92. All of these are more elaborate and costly than the simple and widely-used LOCOS process. Alternatively, LOCOS can be used in conjunction with planarization of a subsequently deposited polysilicon layer. This approach is described in U.S. patent applications Ser. No. 07/880,880 and Ser. No. 07/874,493, which were previously incorporated herein by reference. Other approaches involve planarizing the dielectric layer deposited over the etched polysilicon layer. This can be done by "reflow" (a process in which the wafer is heated to a high enough temperature to cause the dielectric to redistribute itself on the surface), or by spin coating with a sacrificial layer and etching back. However, these approaches produce imperfect planarization. Alternatively, chemical-mechanical polishing (CMP) can be used to planarize the dielectric layers. Unfortunately, CMP planarization of dielectrics is relatively expensive, and it does not address the problem of different contact hole depths.

A radically different method for producing a completely planar structure was proposed by Wen et al. in Proc. 1991 VLSI Symposium, p. 83. In their method, oxide-filled deep trenches are produced by a planarized trench isolation technology such as described by Davari, et al. Technical Digest of 1989 IEDM, p. 61. Presumably, the top surface of these oxide trenches will be coplanar with the surrounding silicon substrate. Next, an unconventional reactive ion etching (RIE) process is used to etch grooves where polysilicon runners are desired. These grooves must traverse both the active silicon areas and the trench fill oxide areas. Thus, the etch process must remove silicon and silicon dioxide at exactly the same rates to ensure that a flat groove bottom is produced where the runner crosses from field to active regions. On the silicon regions of the grooves, a thin gate oxide is grown. A layer of polysilicon is thereafter deposited over the entire surface, and CMP is used to polish it back to the top of the groove. Thus, according to Wen et al., a planar MOSFET is produced.

Although Wen, et al. have described a fully planar process, it suffers from certain difficulties. First, the technique for preparing oxide-filled deep trenches is expensive and difficult to perform. Second, the etch process must remove oxide and silicon at identical rates. Such processes have proven quite difficult to control. Third, the thin gate oxide must be grown in the bottom of an etched groove in the silicon, a difficult process which does not assure a high integrity oxide. Fourth, the areas where the source and drain regions of the MOSFET meet the channel region over the gate are buried by the deposited layer of polysilicon. Thus, the doping profiles of the source and drain can not be aligned with the gate during ion implantation, and the method must rely on diffusion alone to tailor the profiles.

Thus, it is seen that improvements are still needed in the MOSFET fabrication procedures.

SUMMARY OF THE INVENTION

The present invention provides a simple, fully planar procedure for fabricating MOSFETs. Thus, planar surfaces are provided for each photolithography step, resulting in increased patterning precision and accuracy. MOSFETs produced by this procedure, therefore, will generally have smaller feature widths, higher packing densities, and higher current outputs than MOSFETs produced by conventional non-planar processes. In addition, the present invention employs only conventional, simple process steps, unlike the process of Wen et al. which requires more exotic process steps. In addition, this fully planarized process is performed without requiring planarization of a dielectric layer. Thus, expense is kept to a minimum.

A preferred MOSFET according to the present invention includes source, drain, and gate areas formed in an active region (surrounded by field oxide) on a semiconductor substrate. Source and drain contacts are connected to the source and drain areas and a gate and gate dielectric lie over the gate area. The gate and the source and drain contacts are preferably vertically disposed plugs formed in openings within an insulating material on the substrate surface. The gate and the source and drain contacts each terminate in coplanar surfaces parallel to and above the substrate surface. Each of these is also coplanar with the surface of the surrounding field oxide. The insulating material includes a plurality of spacers electrically isolating the gate, source contact, and drain contact from one another. Each of the spacers also terminates in a surface coplanar with the top surfaces of the conductive plugs. The source and drain will have doping profiles aligned with the gate.

A preferred process for fabricating semiconductor devices on the surface of a semiconductor substrate involves first forming a field oxide around active regions on the substrate's surface such that the field oxide surface extends above the substrate surface. Thus, voids are formed immediately above the active regions. These voids are filled by depositing a layer of polysilicon over the surface of substrate and subsequently planarizing it to the level of the underlying field oxide. Next, a dielectric layer is deposited over the entire planarized substrate surface. Because the surface was previously planarized, the dielectric surface is likewise planar. The dielectric layer is then selectively etched to define slots for interconnects between devices and openings into the active regions. The etched slots and openings are filled by depositing a second layer of polysilicon over substrate and planarizing it back to the surface of the dielectric layer. The polysilicon filling the active areas is then etched to form a gate and openings to the source and drain regions. Finally, the source and drain regions are doped and filled with conductive contact material.

Depending upon the exact sequence of steps and the ultimate device to be fabricated, other steps may be necessary. For example, it will be necessary to add a dielectric spacer at the edges of the gate to electrically isolate the gate from the source and drain regions. Spacers may also be necessary to isolate the source and drain regions from interconnect lines formed on top of the field oxide. In addition, extra implantation or diffusion steps may be necessary to tailor the doping profile of the device elements. For example, it may be necessary to heat the substrate after the source and drain contact materials have been added to diffuse dopants from the contact material into the underlying semiconductor substrate. Finally, it will usually be necessary to form a thin gate dielectric layer on the active region before the first polysilicon layer is deposited.

An example of a more detailed method for forming MOS devices on the surface of a semiconductor substrate involves the following sequence of steps. First, a field oxide is formed around the active regions of the surface as before such that the field oxide surface is raised above the substrate surface. Next, a gate dielectric is formed over the active regions selected for fabrication of MOS devices. The active regions are then filled by depositing a first layer of polysilicon over the surface of semiconductor substrate and planarizing to the level of the field oxide surface. A planar dielectric layer is then deposited and selectively etched to define slots and openings corresponding to interconnects and active regions. Next, a second layer of polysilicon is deposited over the dielectric layer and planarized to the surface of the dielectric layer such that the polysilicon fills the areas where the dielectric has been etched away. Gate, source, and drain areas are formed by selectively etching the polysilicon in the active areas. Finally, the source and drain areas of the active regions are doped with impurities of a conductivity type selected to create the desired conductivity for the source and drain regions.

In the above-described embodiments, two polysilicon layers are deposited during the fabrication procedure. In some instances, however, it will be necessary to deposit only a single polysilicon layer. This will be the case, if, for example, the field (or isolation) oxide layer is initially coplanar with the semiconductor substrate. Thus in an alternative preferred embodiment, planarized MOSFETs are formed on the surface of a semiconductor substrate by first forming a gate dielectric over selected active regions of a planar substrate surface. Fabrication then proceeds according to the above embodiment with a dielectric layer being formed and etched followed by deposition of a single polysilicon layer which is planarized. As before, the MOS device elements are created by selected etching and doping of the gate, source, and drain areas of the active regions.

DESCRIPTION OF THE SPECIFIC EMBODIMENTS

Certain terms used herein are intended to have the following general definitions.

A "step" refers to a sharp height variation on the surface of a semiconductor substrate such as a wafer, semiconductor device or partially fabricated semiconductor device. In many embodiments, a step is a height variation of about 1.0 micrometers or less over a distance of less than about 1.0 micrometers along the surface of the surface of the semiconductor substrate. Most typically, the height variation is between about 0.1 and about 0.5 micrometers. A step will often be present at the edge of an active area on the semiconductor substrate. For example, a step is typically present at the edges of a active region and the field oxide on the surface of a semiconductor substrate used to produce a MOS device. Also, for example, steps are typically found at the edges of emitter contact regions on a semiconductor substrate used to produce a bipolar device.

"Planarization" refers to a process of selectively removing material from the surface of a wafer, semiconductor device or partially fabricated semiconductor device such that the surface is rendered flatter. Typically, steps or other height variations on the surface being planarized are removed or reduced. The planarization process may continue after the steps or height variations on the surface have been substantially removed, reducing a layer's thickness. This process can, in some instances, be controlled by forming an etch or polishing "stop" such as a field oxide or nitride layer, in the underlying structure. A stop is a layer of material having a substantially lower removal rate than that of the primary material being polished. In lieu of a stop, the amount of material removed may be controlled by carefully monitoring the process and stopping planarization after a preselected amount of material has been removed.

"Polysilicon" refers to a polycrystalline material (as opposed to a single crystal) that is primarily composed of a silicon. Typically, the polysilicon will be doped to alter the concentration of mobile charge carriers and hence alter the conductivity. Typical dopants include n and p type materials (e.g., phosphorous and boron) well known in the art. In addition, other materials such as oxygen may added which reduce the conductivity of the polycrystalline silicon. In some applications, the polysilicon will include refractory metal silicides such as titanium, tungsten, platinum and molybdenum silicides. In addition, the polysilicon may include some other additives and impurities such as other semiconductors (e.g. germanium), metals and non-metals in varying amounts.

"Gate" refers to the metal or semiconductor that contacts the top of a gate dielectric in an MOS device. The gate may be made from any of number of metals, alloys, semiconductors and doped semiconductors. Preferred gate materials include polycrystalline semiconductors such as polysilicon, polycrystalline germanium and combinations thereof. Other materials having a suitable work function may also be employed.

"Active region" refers to the region of a semiconductor surface where the semiconductor device is fabricated. Typical devices include transistors, capacitors, and fuses. Gates, sources, and drains are typically constructed on active regions of MOS devices, while emitters, bases, and collectors are constructed on active regions of bipolar devices. Typical MOS devices require one active region while typical bipolar devices require two active regions. Active regions are separated from one another by isolation regions typically covered by a field oxide. It is to be recognized that while the metal contact directly on top of the active region of a bipolar device is referred to herein as the emitter contact, this region is sometimes referred to by those of skill in the art as an emitter.

Figures 1, 2:
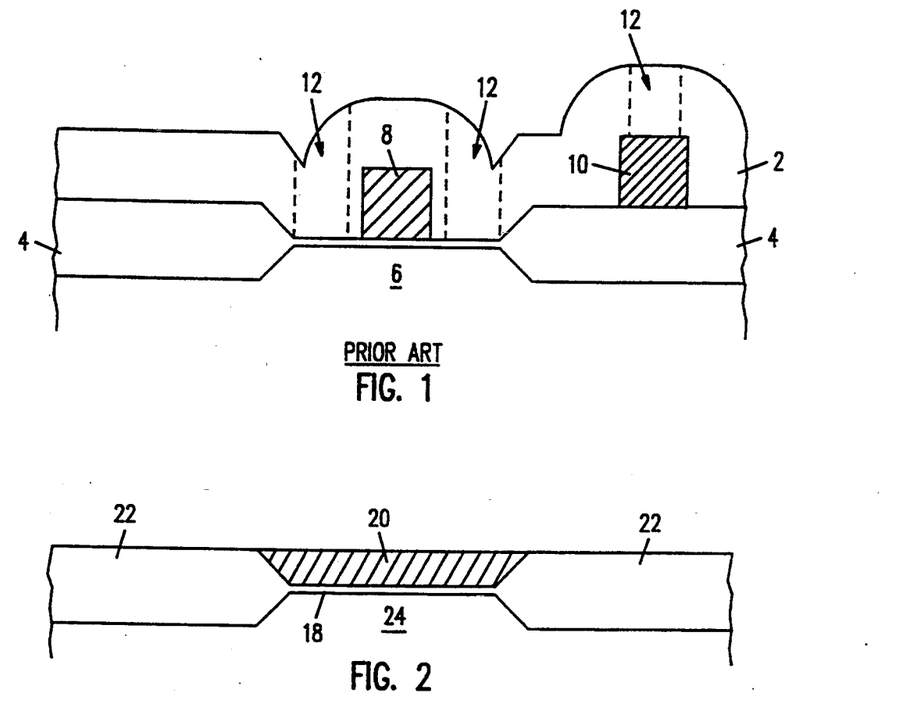
FIG. 1 displays a cross-section of a partially fabricated MOSFET prepared by techniques in conventional fabrication processes.
FIGS. 2-5 display a sequence of partially fabricated MOSFET cross-sections as produced by a preferred process of the present invention; process steps include depositing first and second polysilicon layers, planarizing those layers, depositing a dielectric layer, and patterning the surfaces to produce an MOS transistor.
Figure 3:
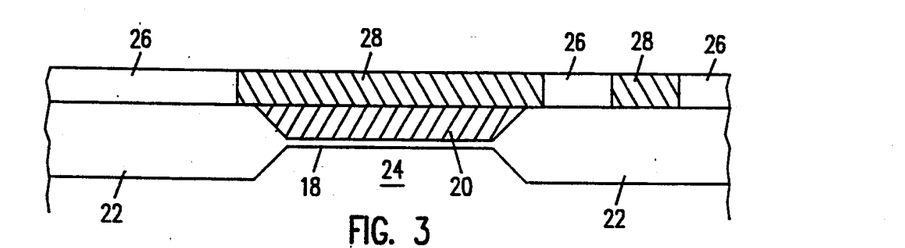

FIG. 1 displays a partially fabricated MOSFET produced according to typical prior fabrication methods. The protrusions and valleys on the upper surface of a dielectric layer 2 are caused by the topography of the underlying structure which includes a field oxide layer 4, an active area 6, a gate 8, and an interconnect 10. Also shown are the contact openings 12 used to form vertical interconnects between the underlying device elements and an overlying metallization layer (not shown). The present invention provides an alternative to traditional fabrication processes, providing substantially planar structures (unlike the "rough" structures shown in FIG. 1).

Figure 4:
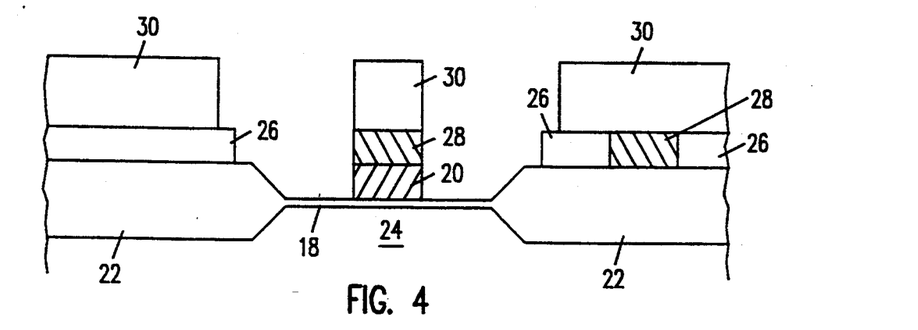
Figure 5:
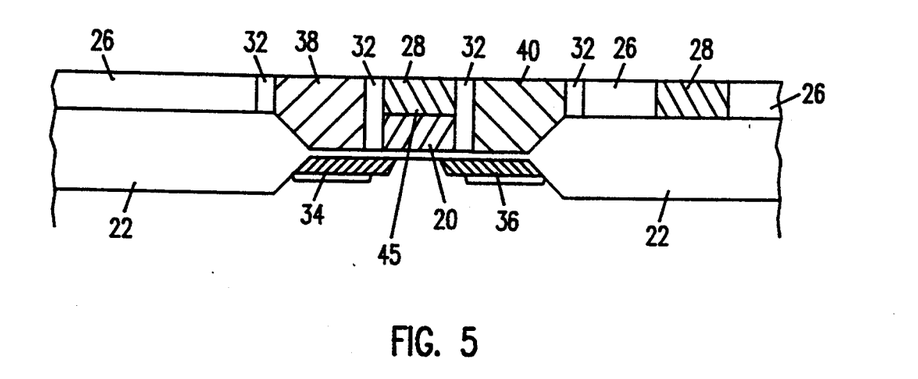
Figure 6:
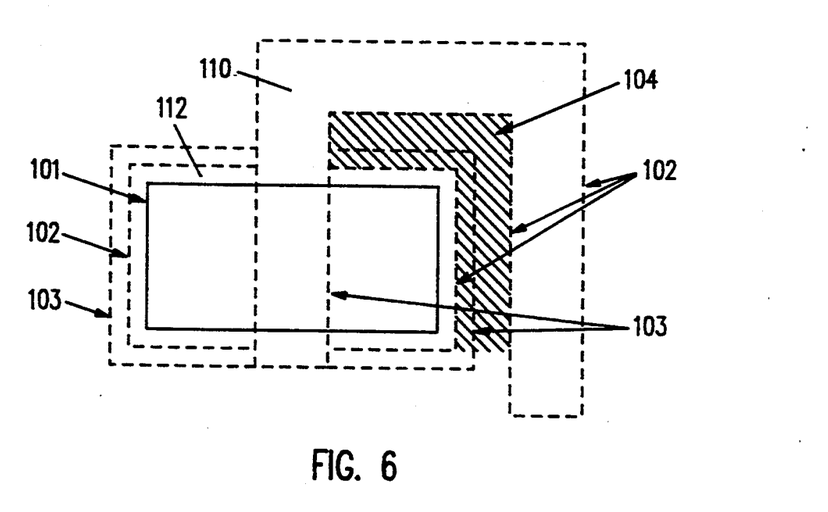
FIG. 6 is a representation of a set of three masks used with a preferred method.

The method of the present invention is now outlined according to a preferred embodiment represented in FIGS. 2–5. FIG. 6 shows a preferred combination of three photomasks which may be used to practice the present invention. It should be noted that, the final structure prepared according to the present invention will be equally planar to the structure prepared according to the method of Wen et al. Further, all intermediate lithography steps in this invention are carried out on planar surfaces, while the enumerated disadvantages of the method of Wen et al. are avoided.

In the first step of the present invention, active areas are defined and isolated on a doped silicon wafer. Silicon nitride or another material suitable for protection against oxidation is then deposited over the active areas. Preferably, a mask 101 shown in FIG. 6 is used to selectively expose a photoresist on the nitride surface. The photoresist pattern is then developed and the nitride is etched. Next, a field oxide is grown over the unprotected areas according to methods well-known in the art such as thermal oxidation. Preferably, these steps will be conducted according to the well-known LOCOS technique or a related process. Alternatively, a sheet of field oxide could be formed over the entire surface of the substrate and subsequently etched to open active regions. Either approach will produce a stepped surface in which the active regions lie in voids surrounded by field oxide. A planarized isolation process could also be used if desired, but is not necessary to the final planarity of the structure of the current invention.

Next, the region underlying the active area is doped by ion implantation or other suitable technique to form a channel, above which a thin layer of gate dielectric 18 is grown. Gate dielectric 18 will typically be an oxide such as silicon dioxide, but other materials having suitable electrical properties may also be employed. Gate material 20 is then deposited over the entire substrate surface including the gate dielectric 18. Gate material 20 is typically a polycrystalline semiconductor such as polysilicon, but other well-known gate materials will be equally suitable in some applications. The polysilicon is deposited to a thickness slightly greater than the step size at edge of field oxide 22 and gate oxide 18. Typically, a conformal deposition process such as chemical vapor deposition (CVD), sputter deposition or evaporation will be employed. Because the deposition is at least partially conformal, the polysilicon layer will follow the general contours of the underlying substrate, characterized by sunken active regions 24 surrounded by a field oxide 22.

At this point, the surface of the polysilicon layer is planarized back to the surface of the field oxide resulting in the structure shown in FIG. 2. Thus, the freshly deposited polysilicon layer which originally contained steps as large as 1 $\mu$m is now substantially planar, containing steps typically no larger than about 0.1 $\mu$m. Preferably, chemical-mechanical polishing (CMP) is employed to planarize the polysilicon layer. However, other methods such as spinning a sacrificial layer and etching back, as well as other techniques well-known in the art can also be used. U.S. patent application Ser. No. 07/874,493 describes the details of a suitable CMP process (and other techniques) for planarizing polysilicon layers. As explained there, CMP is preferably conducted with an alkaline slurry of silica and a polyurethane pad such as one selected from the SUBA series (e.g., SUBA 500, manufactured by Rodel, Inc., Scottsdale, Ariz.). Most preferably, the conditions employed will result in the polysilicon being polished at a much faster rate than the field oxide. Thus, the field oxide will act as a natural stop, preventing the substrate from being overpolished and potentially damaging the active areas. Polishing conditions which favor rapid removal of polysilicon in comparison to silicon oxide include low solids content in the slurry, high slurry pH, and high pad temperatures. By using appropriate conditions, it is possible to obtain etch rate ratios as great as 100:1 polysilicon to silicon dioxide. Other polishing stops may also be employed such as silicon nitride which may deposited as a thin layer over the field oxide. The etch rate ratio between polysilicon and silicon nitride may even exceed 100:1.

Next, a dielectric layer 26 is deposited over the planarized substrate surface of FIG. 2. The dielectric is preferably silicon dioxide, but other dielectrics such as silicon nitride may also be employed. The dielectric is deposited by any suitable technique known in the art, and preferably by chemical vapor deposition. Because the dielectric layer 26 has been deposited on a planar surface it too contains a planar upper surface. This should be contrasted with the dielectric surface obtained with conventional techniques and displayed in FIG. 1.

To this point, no provisions for interconnects (the thin "wires" on the integrated circuit that connect the various devices) have been made. In previous methods, such as that displayed in FIG. 1, interconnects 10 were typically formed before the dielectric layer was deposited, thus causing additional protrusions on the dielectric surface. In contrast, the present method forms interconnects only after a planar dielectric layer has been deposited.

To this end, mask 102 (shown in FIG. 6) is used in a photolithographic process to define openings in planar dielectric layer 26 including interconnect region 110 and active area region 112. Mask 102, as shown in FIG. 6, contains first the patterns of the active areas as on mask 101, but is oversize by an amount sufficient to ensure that gate layer 20 is completely exposed. The amount of enlargement needed depends on a number of factors including misalignment tolerance, critical dimension control tolerance, and encroachment of the field oxidation process. Mask 102 also contains patterns for the gate metal interconnect runners in the field oxide areas. Thus, dielectric layer 26 should be of a thickness equal to that required by the circuit design for the gate metal runners on field oxide regions. This thickness will preferably be in the range 0.1–1.0 μm. It should be noted that mask 102 contains certain regions which may be required to avoid violating minimum spacing design rules of the photolithographic process. Such violations can occur because the bias required to ensure complete exposure of layer 20 in the active regions may require that the distance between an active area boundary on mask 102 and the edge of an interconnect runner in the field be less than the minimum spacing allowed by the photolithographic process. If this is the case, the entire region between the interconnect slot and the active region may be exposed. Shaded region 104 in FIG. 6 is an area which could thus be added to mask 102.

The etch process used with mask 102 will preferably be an anisotropic dry etch process, which continues until dielectric layer 26 is completely cleared from layer 20 in the active areas. Because layer 26 is planar, the active regions and the field regions are equally exposed during photolithography. And because layer 26 is uniformly thick, the etch times required for each section will be similar. Nevertheless, some overetch may be required to clear the active areas completely, resulting in minor trenching of the field oxide. However, the thick field oxide (0.2–1.0 μm) provides sufficient margin for such overetching. If a planarized isolation technology is used (and polysilicon layer 20 is omitted), the etch of layer 26 is terminated when the silicon in the active area is exposed. In this case, control of the etching process becomes more important, as the field oxide should not be trenched below the level of the active area silicon.

Next, a layer 28 of polysilicon or other conductive material is deposited over the etched dielectric layer 26. Layer 28 serves primarily as a contact or wiring material (unlike layer 20 which ultimately serves as a gate) and therefore may be selected from a variety of materials on the basis of conductivity rather than work function. Thus, in addition to polysilicon, the material employed in layer 28 can be a refractory metal silicide, tungsten, titanium, titanium nitride, molybdenum, tantalum or other suitable conductive material. It need not be the same material as layer 20. However, layer 28 must withstand the temperatures and atmospheres used in subsequent annealing and oxidation steps, and it must form adequate electrical contact to polysilicon layer 20. In addition, layer 28 should not undergo undesirable reactions with the underlying material. Of course, if polysilicon layer 20 is omitted, conductive layer 28 must also satisfy the work function requirements of the transistor design. Regardless of which process is used, the material deposited on the gate oxide should have a work function which is suitable for the proper electrical function of the MOSFET. Doped polysilicon is one such suitable material.

Because grooves and openings have been etched in dielectric layer 26, conductive layer 28 will initially be nonplanar. Thus, conductive layer 28 is planarized to remove any steps and provide a flat surface for subsequent photolithography steps. To prevent shorting between the device elements and interconnects, planarization should continue until dielectric layer 26 is reached. If polysilicon is used in layer 28, the planarization step is preferably conducted with CMP as described above. If other materials are used, the planarization conditions may have to be altered as is known in the art. The resulting structure is displayed in FIG. 3. At this point an optional dielectric layer (not shown) may be deposited to increase the spacer height (i.e. the distance between the structures described and an overlying metallization layer).

Referring now to FIG. 4, gate, source and drain dimensions are defined by mask 103 (shown in FIG. 6) and photoresist layer 30 is selectively exposed. As shown in FIG. 6, mask 103 defines source and drain regions which extend slightly beyond the active region boundaries defined in mask 101. This ensures that conductive layer 28 over the active area is completely exposed except, of course, where the gate crosses the active area. The amount of mask bias required on the active area boundaries of mask 103 depends upon such factors as alignment tolerances, critical dimension control, and the bias used on mask 102. The width of the central strip of mask 103 defines the gate area of the MOSFET, and its width must therefore be carefully defined to assure that the electrical performance of the MOSFET is adequate. A smaller gate width generally results in increased current output.

Next, an anisotropic dry etch process is used to etch away conductive layer 28 and polysilicon layer 20 in the active region and expose portions of the underlying gate dielectric and field oxide. In addition, dielectric layer 26 is exposed at the perimeter of the active area as shown in FIG. 4. This etch process must have sufficiently greater etch rates for polysilicon layer 20 than for gate dielectric 18 to avoid penetrating the gate dielectric during any overetch required to clear the exposed portions of the active areas. The exact nature of this etch depends upon the materials and equipment available, but several suitable etch processes are known in the art. For example, suitable reactive ion etch processes can employ a mixture of halogen-containing gases, such as $Cl_2$, HBr, $CF_4$, and the like, combined with inert gases such as helium or argon. Controlled etch ratios between the dielectric and gate material are achieved by varying the ratio of gases and, in some instances, the power of the etcher. One preferred mixture for etching polysilicon according to the present invention includes helium, hydrogen bromide, and chlorine gases in the volumetric ratio 5:2:2.

At this point in the process of the present invention, the source and drain areas of the transistor are exposed and accessible for implants to tailor their doping profiles. A number of strategies exist in the art for designing these profiles, and any of these can be applied at this stage of the process. For example, a light oxidation can be carried out to seal the sidewalls of layers 20, and 28 and form small "bird beaks" in the gate dielectric 18 at the edges of the active gate. Then an implant can be used to provide source and drain doping layers at the surface of the active area which are self-aligning to the edges of the gate. In addition, implants can be made at high angles with respect to the underlying silicon substrate if required by the device design.

Next, dielectric spacers 32 are formed on the sidewalls of the gate and the exposed vertical edges of conductive layer 26. These spacers are produced by current art processes and can be composed of silicon dioxide, silicon nitride or other suitable dielectric. Note that if the active area and the interconnect area are not separated by mask 102 (i.e. shaded area 104 of FIG. 6 connects the active region with the interconnect region), dielectric layer 26 will not separate the interconnect 28 from the active area opening. Thus, the runner 28 will extend to the edge of the resist as defined by mask 103, rather than being separated by dielectric 26 as shown in FIG. 4. In such cases, the spacer 32 will be formed on the side of the runner 28 rather than on the edge of the dielectric sidewall 26 as shown in FIG. 5. Spacer 32 will then provide the only separation of runner 28 from source or drain plug 40 formed in the next step of the process. After spacer formation, additional implants can be used if desired to further adjust the source and drain doping profiles. These implants will, of course, be self-aligned to the spacer on the gate sidewall.

Following spacer formation and any desired doping modifications to the source and drain regions, the next step according to this invention is to fill the openings above the source and drain regions and planarize, if necessary, to produce the structure of FIG. 5. Several options for accomplishing this can be employed depending upon the MOSFET design. In one option, any residual gate dielectric is cleaned out of the active regions and a polysilicon layer is deposited over the wafer. CMP is then used to planarize the surface as was previously conducted on layers 20 and 28. If the polysilicon is appropriately doped (before or after deposition), a final annealing step may then be used to diffuse the dopant uniformly through plugs 20, 28, 38, and 40 and out of plugs 38 and 40 into the single crystal silicon to form shallow source drain junctions as indicated in FIG. 5.

Alternatively, polysilicon or epitaxial single-crystal silicon may be grown by a selective CVD process on the exposed silicon in the source and drain areas only. The deposition can be terminated when the growing deposit reaches the level of the upper surface, so no additional planarization step is needed. This process requires deposition of a thin layer of dielectric (typically 0.50–0.15 μm) over the structure of FIG. 3 prior to applying the resist for mask 103. This layer remains in place through the etch and spacer formation steps such that no sections of conductive layer 28 will be exposed during the selective CVD process. If single-crystal epitaxial silicon is elected in this option, it will often be necessary to use in-situ doping during the CVD process because the heat treatment required to diffuse implant dopant through a single-crystal layer is incompatible with the shallow junctions required in modern MOSFETs.

In a third option, a barrier metal is first deposited, and then another material, such as tungsten, titanium, titanium nitride, aluminum, copper or a refractory metal silicide, is deposited as is commonly used for making contacts in conventional processes. If this option is used, the doping of the source and drain regions and the gate layers must be complete, including any implant activation anneals, prior to metal deposition. In addition, the metal layer may have to be planarized by CMP to produce the structure of FIG. 5. Alternatively, a selective CVD process for the plug metal can be used as described above, in which case no planarization is required.

The structure of FIG. 5 is a complete MOSFET according to the present invention. As shown, the final structure includes source 34, drain 36 and gate 45 areas formed in an active region of a semiconductor substrate and surrounded by a field oxide 22. In addition, the MOSFET is provided with source and drain contacts 38 and 40, and a gate 45 (overlying a gate dielectric) each of which forms a conductive vertical plug disposed in openings in the insulating spacers and field oxide. The source and drain contacts are in conductive contact with the substrate surface where the actual source and drain have doping profiles aligned with said gate. The planar structure of the MOSFET results in the gate 28 and the source 38 and drain 40 contacts terminating in surfaces coplanar with the field oxide's top surface, which is above and substantially parallel to the substrate surface. In addition, the spacers each terminate in a surface coplanar with the terminating surfaces of the gate, and source and drain contacts.

To continue the fabrication process, a dielectric layer may be deposited over the planar surface shown in FIG. 5. Contact holes or vias are subsequently etched using well-known techniques. Note that these contacts will be of uniform depth, unlike those in prior MOSFETs such as the one shown in FIG. 1. An overlying metallization layer can then access the MOSFET through these holes, and all masking layers in the entire integrated circuit can be carried out on planar structures.

Figure 7A:
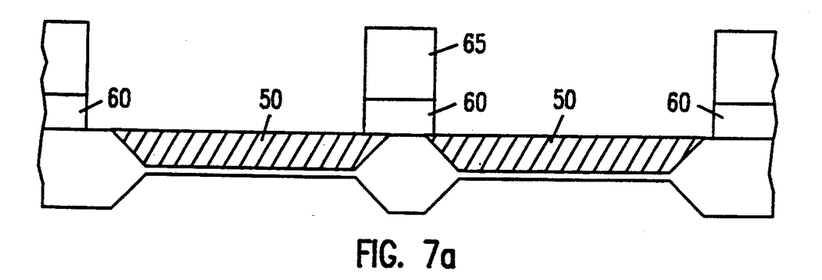
FIGS. 7(a)-(b) display the fabrication steps used to produce two adjacent MOSFETs according to a fabrication method.
Figure 7B:
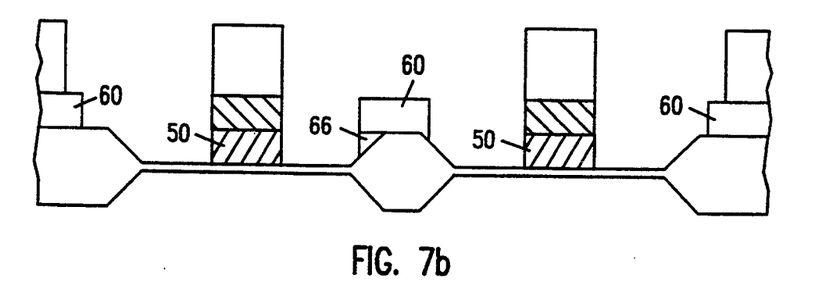

As mentioned above, the first conformal polysilicon layer can be dispensed with if the field oxide layer is sufficiently coplanar with the silicon substrate. However, there may be some circumstances in which this approach can be applied even when the field oxide is elevated above the plane of the silicon substrate. Such process may be beneficial when very narrow segments of field oxide separate to adjacent MOSFETs as shown in FIG. 7(a). As shown there, a region of polysilicon layer 50 can be present under dielectric layer 60 and photoresist 65 in the region between the MOSFETs. Thus, as shown in FIG. 7(b), a small ribbon or beak of polysilicon 66 may be present in the resulting structure after etching steps. In severe cases, the ribbon could short between the adjacent MOSFETs.

Figure 8A:
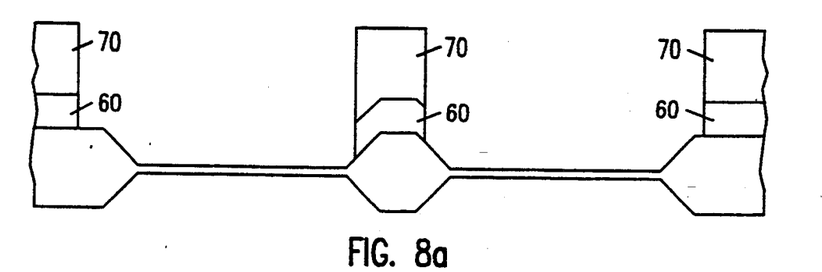
FIGS. 8(a)-(b) display the fabrication steps used to produce two adjacent MOSFETs according to an alternative embodiment of the present invention.
Figure 8B:
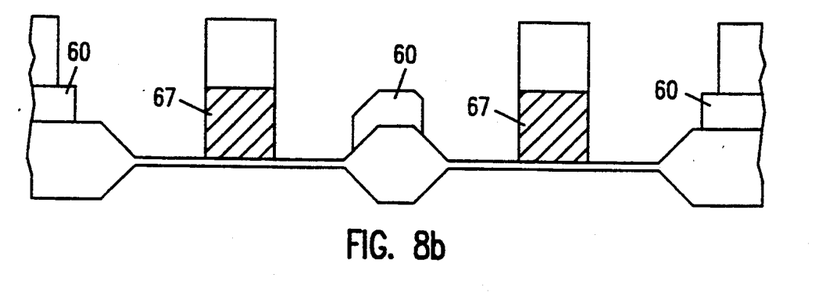

To avoid this problem, the steps of depositing polysilicon layer 50 and its subsequent planarization are eliminated. In this process, after the field oxide has been grown, dielectric layer 60 is deposited over the entire substrate surface and planarized, if desired, depending upon the needs of the particular application. Dielectric layer 60 is then coated with a photoresist 70 and irradiated through masks comparable to mask 102 (FIG. 6) and etched to provide the structure shown in FIG. 8(a). Next, after a gate oxide is grown, a conductive layer 67 (preferably polysilicon) is deposited and planarized as in the previous embodiments. It is subsequently patterned and etched to form the gate, source, and drain regions as shown in FIG. 8(b). The remaining fabrication steps parallel those discussed for the previous embodiments.

Conclusion

All processing steps used in the present invention are easily performed and are, for the most part, commonly used in the art for a variety of purposes. Nevertheless, these steps provide several advantages over previous fabrication processes as described above.

The present invention employs three masks rather than the two used in many prior processes. In addition, it employs two or three planarization steps rather than none used in many prior processes. However, each step in the method of this invention is less critical and has larger process margins than comparable steps in previous methods. The planar structure produced by the method of this invention also eases process margins for later processing of overlying interconnect layers.

It can be seen that the present invention avoids the enumerated disadvantages of the method of Wen et al. First, the isolation region need not be coplanar with the substrate in this invention. In fact it is preferable that the field oxide be prepared by LOCOS, thereby having a top surface elevated above the active regions. This provides some margin for overetching in subsequent steps. Second, the present invention does not require an exotic etch process which matches the etch rates of the silicon substrate and the isolation oxide. Third, the gate dielectric employed in the present invention is grown on a completely open active area. This is a significantly simpler process than growing oxide on the grooves produced by the method of Wen et al. Fourth, the source and drain areas in the present invention are completely accessible to implants necessary for tailoring the doping profiles.

It will be apparent to those of skill in the art that although the present invention has been described above in terms of a preferred embodiment, numerous modifications can be made without departing from the spirit and scope of the invention. For example, the above process has been described primarily in terms of fabrication of MOSFETs. However, certain bipolar technologies employ polysilicon contacts to the emitters, bases, and collectors of the transistors, and well as for interconnect runners. It will be recognized that the process described above can be used to prepare a bipolar structure very similar to that shown in FIG. 5, with the exception that thin gate dielectric layer 18 is not formed. Of course, the doping profiles will have to be tailored as necessary to produce a bipolar device. The modification to the above process necessary to produce such a structure will be readily apparent to those of skill in the art. This and other modifications are intended to be included within the scope of the claims appended hereto.

What is claimed is:

1. A process for fabricating semiconductor devices on a surface of a semiconductor substrate provided with active regions on which MOS devices are formed, said process comprising the following steps:
   forming a field oxide around said active regions such that the surface of the field oxide surrounding the active areas is raised above the surface of the semiconductor substrate and voids are formed over the active regions;
   forming a gate dielectric over selected active regions on the semiconductor substrate;
   depositing a layer of polysilicon over the surface of the semiconductor substrate and planarizing to the surface of field oxide such that the polysilicon fills the voids above the active regions;
   forming a dielectric layer over the planarized substrate surface;
   selectively etching the dielectric layer to define slots and openings over regions of said polysilicon layer and regions of said field oxide corresponding to interconnects and active regions;
   depositing a conductive layer over the dielectric layer and planarizing to the surface of said dielectric layer such that conductive material fills the slots and openings where the dielectric has been etched away;
   selectively etching the polysilicon and conductive layers using a mask to define gate, source, and drain areas in the active regions; and
   doping the source and drain areas of the active regions with impurities of a conductivity type selected to create the source and drain regions.

2. The method recited in claim 1 wherein the polysilicon layer is planarized by chemical-mechanical polishing.

3. The method recited in claim 2 wherein the chemical-mechanical polishing employs a polishing medium including silica particles and an aqueous alkaline solution.

4. The method recited in claim 1 wherein the conductive layer includes a material selected from the group consisting of refractory metal silicides, tungsten, titanium, titanium nitride, molybdenum, tantalum and doped polysilicon.

5. The method recited in claim 1 further comprising the following steps:
   forming dielectric spacers separating the gate areas from the source and drain areas;
   removing said gate dielectric from the source and drain areas; and
   filling the region above the source and drain areas with conductive material to form source and drain contacts.

6. The method recited in claim 5 wherein said conductive material comprises materials selected from the group consisting of polysilicon, tungsten, titanium nitride, aluminum, copper and refractory metal silicides.

7. The method recited in claim 6 wherein the conductive material includes polysilicon having a concentration of conductivity increasing dopants.

8. The method recited in claim 7 further comprising the step of heating the conductive material to diffuse dopants into the source and drain regions of the substrate.

9. A method for fabricating planarized MOSFETs on the surface of a semiconductor substrate, said method comprising the following steps:
   forming active regions on the surface of the semiconductor substrate, said active regions surrounded by a field oxide such that the surface of the field oxide surrounding the active areas is raised above the surface of the semiconductor substrate and voids are formed above the active regions;
   forming a gate dielectric over selected active regions on the semiconductor substrate;
   depositing a layer of polysilicon over the surface of the semiconductor substrate and planarizing to the surface of said field oxide such that the polysilicon fills the voids above the active regions;
   depositing a dielectric layer over the planarized substrate surface;
   using a mask in conjunction with a resist layer formed on said dielectric layer and etching undesired portions thereof to define slots and openings over regions of said polysilicon layer and regions of said field oxide corresponding to interconnects and active regions;
   depositing a conductive layer over the dielectric surface to fill said slots and openings with polysilicon and planarizing to remove polysilicon from the top surface of the dielectric layer;
   using a mask in conjunction with a resist layer formed on the conductive layer and etching undesired portions thereof to define gate, source and drain areas, thereby self-aligning said areas with each other;
   doping source and drain areas of the active regions with impurities of a conductivity type selected to create the source and drain regions;

forming dielectric spacers separating the gate areas from source and drain areas;

removing the gate dielectric from the source and drain areas of the active regions; and filling the region above the source and drain areas with polysilicon to form source and drain contacts.

10. The method recited in claim 9 wherein the polysilicon layer is planarized by chemical-mechanical polishing.

11. The method recited in claim 10 wherein the chemical-mechanical polishing employs a polishing medium including silica particles and an aqueous alkaline solution.

12. The method recited in claim 9 wherein the conductive layer includes a material selected from the group consisting of refractory metal silicides, tungsten, titanium, titanium nitride, molybdenum, tantalum and doped polysilicon.

13. The method recited in claim 9 wherein said source and drain contacts comprise materials selected from the group consisting of polysilicon, tungsten, titanium, titanium nitride, aluminum, copper and refractory metal silicides.

14. The method recited in claim 13 wherein the source and drain contacts include a concentration of conductivity increasing dopants.

15. The method recited in claim 14 further comprising the step of heating the source and drain contacts to diffuse dopants into the source and drain regions of the substrate.

16. A method for fabricating planarized MOSFETs on the surface of a semiconductor substrate, said method comprising the following steps:

delineating active regions on the surface of the semiconductor substrate and forming isolation regions around the active areas on said substrate such that the isolation regions electrically isolate the active regions from each other;

forming a dielectric layer over the semiconductor substrate surface;

selectively etching said dielectric layer to define slots and openings over at least portions of said isolation regions corresponding to interconnects and active regions;

forming a gate dielectric over selected active regions on the semiconductor substrate;

depositing a layer of polysilicon over the dielectric layer and planarizing to the surface of said dielectric layer such that the polysilicon fills the areas where the dielectric has been etched away;

selectively etching the polysilicon to define a gate, and source and drain areas in the active regions;

doping the source and drain areas of the active regions with impurities of a conductivity type selected to create the source and drain regions.

17. The method recited in claim 16 wherein the isolation regions are formed by LOCOS.

18. The method recited in claim 16 further comprising a step of planarizing said dielectric layer.

19. A process for fabricating semiconductor devices on a surface of a semiconductor substrate, said process including the following steps:

delineating active regions on the semiconductor substrate surface and forming a field oxide around said active regions such that the surface of the field oxide surrounding the active areas is raised above the surface of the semiconductor substrate and voids are formed over the active regions;

depositing a layer of polysilicon over the surface of the semiconductor substrate and planarizing to the surface of said field oxide such that the polysilicon fills the voids above the active regions;

forming a dielectric layer over the planarized substrate surface;

selectively etching the dielectric layer to define slots and openings over regions of said polysilicon layer and regions of said field oxide corresponding to interconnects and active regions;

depositing a layer of polysilicon over the dielectric layer and planarizing to the surface of said dielectric layer such that the polysilicon fills the areas where the dielectric has been etched away;

selectively etching the polysilicon using a mask to form polysilicon structures in the active regions;

doping selected areas of the active regions with impurities of a conductivity type selected to create the elements of the semiconductor devices.

20. The method as recited in claim 19 wherein the active region delineates a MOS device.

21. The method recited in claim 19 wherein the active region delineates at least one part of a bipolar device.

* * * * *